US008551869B2

United States Patent
Wang et al.

(10) Patent No.: US 8,551,869 B2
(45) Date of Patent: Oct. 8, 2013

(54) ROUGHENING METHOD AND METHOD FOR MANUFACTURING LIGHT-EMITTING DIODE HAVING ROUGHENED SURFACE

(75) Inventors: Shui-Jinn Wang, Tainan (TW); Wei-Chi Lee, Tainan (TW)

(73) Assignee: National Cheng Kung University, Tainan (TW)

( * ) Notice: Subject to any disclaimer, the term of this patent is extended or adjusted under 35 U.S.C. 154(b) by 199 days.

(21) Appl. No.: 13/165,095

(22) Filed: Jun. 21, 2011

(65) Prior Publication Data

US 2012/0214267 A1    Aug. 23, 2012

(30) Foreign Application Priority Data

Feb. 18, 2011    (TW) .............................. 100105473 A

(51) Int. Cl.
*H01L 21/20*    (2006.01)
*H01L 21/302*    (2006.01)

(52) U.S. Cl.
USPC ........... 438/478; 438/745; 438/940; 438/964; 216/94

(58) Field of Classification Search
None
See application file for complete search history.

(56) References Cited

U.S. PATENT DOCUMENTS

| | | | |
|---|---|---|---|
| 4,932,747 A * | 6/1990 | Russell et al. ................. | 385/115 |
| 6,919,162 B1 * | 7/2005 | Brennen et al. ............ | 430/272.1 |
| 2009/0142874 A1 * | 6/2009 | Arai ................. | 438/57 |
| 2010/0151602 A1 * | 6/2010 | Knollenberg et al. .......... | 438/29 |

OTHER PUBLICATIONS

Huang et al. "Investigation of InGaN/GaN light emitting diodes with nano-roughened surface by excimer laser ethcing method", Materials Science and Engineering B 136 (2007), pp. 182-186.*
F. A. Houle "Basic Mechanisms in Laser Etching and Deposition", Appl. Phys. A 41, (1986), pp. 315-330.*
Wei-Chi Lee, Shui-Jinn Wang, Kai-Ming Uang, Tron-Min Chen, Der-Ming Kuo, Pei-Ren Wang, and Po-Hong Wang; "Enhanced Light Output of GaN-Based Vertical-Structured Light-Emitting Diodes with Two-Step Surface Roughening Using KrF Laser and Chemical Wet Etching" *IEEE Photonics Technology Letters*; Sep. 1, 2010; p. 1318-p.1320; vol. 22, No. 17; 2010 IEEE.
W. C. Lee, S. J. Wang, K. M. Uang, T. M. Chen, D. M. Kuo, P. R. Wang, and P. H. Wang, "Enhanced Light Output of GaN-Based Vertical Light-Emitting Diodes with Superimposed Circular Protrusions and Hexagonal Cones" *Electrochemical and Solid-State Letters*; Nov. 18, 2010; p. H53-p. H56; vol. 14, No. 2; 2010 The Electrochemical Society.
Wei-Chi Lee and Shui-Jinn Wang, "Light Output Improvement for Vertically-Structured Metallic-Substrate High Power GaN-Based Light-Emitting Diode" Institute of Microelectronics, *Department of Electrical Engineering, National Cheng Kung University*, Tainan, Taiwan, R.O.C., *Dissertation for Doctor of Philosophy*; Jan. 2011; National Cheng Kung University, Tainan, Taiwan R.O.C.

* cited by examiner

*Primary Examiner* — Scott B Geyer
(74) *Attorney, Agent, or Firm* — Muncy, Geissler, Olds & Lowe, PLLC

(57) ABSTRACT

A method for roughening an epitaxy structure layer, including: providing an epitaxy structure layer; and etching a surface of the epitaxy structure layer by an excimer laser having an energy density of 1000 mJ/cm² or less to form a roughened surface. In addition, a method for manufacturing a light-emitting diode having a roughened surface is provided.

10 Claims, 7 Drawing Sheets

ROUGHENING METHOD AND METHOD FOR MANUFACTURING LIGHT-EMITTING DIODE HAVING ROUGHENED SURFACE

CROSS REFERENCE TO RELATED APPLICATION

This application claims the benefits of the Taiwan Patent Application Serial Number 100105473, filed on Feb. 18, 2011, the subject matter of which is incorporated herein by reference.

BACKGROUND OF THE INVENTION

1. Field of the Invention

The present invention relates to a novel roughening method and a method for manufacturing a light-emitting diode having a roughened surface.

2. Description of Related Art

Currently, the research on GaN-based blue LEDs has been disclosed in international journals and technical reports with respect to photoelectric technologies. Their performance and manufacturing methods have been significantly improved. However, higher efficiency, more output power and enhanced luminous flux are required for the development of white light LEDs in the application of lighting and display fields.

FIG. 1A shows a conventional lateral GaN-based LED, which mainly includes: a sapphire substrate 11; a buffer layer 111 on the sapphire substrate 11; an epitaxy structure layer 12, including an n-GaN layer 121, an active layer 122 and a p-GaN layer 123 formed on the buffer layer 111 in sequence, therewith the n-GaN layer 121, the active layer 122 and the p-GaN layer 123 being partially removed to expose a partial area of the n-GaN layer 121; a transparent conductive layer 18 on the p-GaN layer 123; and two electrodes 13, 17, which are ohmic contacted with the p-GaN layer 123 and the n-GaN layer, respectively. However, the light output efficiency of the conventional lateral GaN-based LED in which the two electrodes 13, 17 are disposed at the same side of the epitaxy structure layer 12 is largely limited due to restricted effective area, long conduction path, large series resistance and current crowding effect near the electrodes. In particular, the light emission surface is close to the emissive layer (about 0.5 μm), and thus the surface roughening degree is limited. Consequently, the light output efficiency cannot be further enhanced, and conventional lateral LEDs cannot meet the requirements for high light output power. Additionally, in high power operation, the poor heat dissipation of the sapphire substrate 11 used in the conventional lateral structure would cause the reduction of luminous intensity and efficiency, and even the change of luminous wavelength and reduction of reliability and life, resulting in the serious limitation in high power operation.

To overcome those drawbacks of conventional lateral LEDs, vertical-structured GaN-based LEDs (abbreviated as VLEDs hereafter) have been suggested. In the VLEDs, two electrodes are respectively disposed at an upper side and a lower side of the epitaxy structure layer, and thus the thickness of the epitaxy structure layer is the distance between the two electrodes. Accordingly, the drawbacks of large series resistance in the conventional lateral LEDs can be resolved.

FIG. 1B shows a cross-sectional view of a vertical-structured GaN-based LED. As shown in FIG. 1B, the vertical-structured GaN-based LED mainly includes: a substitutive substrate 11'; an electrode 13, which includes an ohmic reflective layer 131 and an adhesive layer 132 and is disposed on the substitutive substrate 11'; an epitaxy structure layer 12, which includes a p-GaN layer 123, an active layer 122 and an n-GaN layer 121 on the electrode 13 in sequence; and an electrode 17, which is ohmic contacted with the n-GaN layer 121. In conventional art, the replacement of the sapphire substrate with the substitutive substrate 11' is implemented with the use of laser-lift-off (LLO) technique and electroplated or wafer-bonded conductive substrates. In addition, the light emission surface of the VLED is far from the emissive layer, and thus the light output efficiency of VLEDs can be significantly enhanced by roughening the light emission surface. The suggested roughening technologies include: (1) creating photonic crystal on the surface by e-beam writer; (2) roughening the surface to form a textured structure of hexagonal cones by photo-assisted cryogenic etching; (3) performing a dry etching process with a metal nanomask (i.e. a photolithography technology); and (4) removing the u-GaN layer by inductively coupled plasma (ICP), and then performing a wet etching process to create a textured structure of hexagonal cones. Among them, the former three methods have the disadvantages of low throughput and difficulty in commercialization due to their complex process and long roughening time. Thereby, the fourth method is the commonly used roughening technology.

SUMMARY OF THE INVENTION

The object of the present invention is to provide a novel roughening method, which can be applied on an epitaxy structure layer of a light-emitting diode to enhance the light extraction efficiency and reduce operation voltage of an LED, as well as to resolve the conventional art problems of process complexity, time consumption and high cost.

To achieve the object, the present invention provides a method for roughening an epitaxy structure layer, which includes: (A) providing an epitaxy structure layer; and (B) etching a surface of the epitaxy structure layer with an excimer laser having an energy density of 1000 mJ/cm$^2$ or less to form a roughened surface. Herein, the epitaxy structure layer preferably is a GaN-based epitaxy structure layer, and may include a first semiconductor layer, an active layer and a second semiconductor layer, therewith the active layer being located between the first semiconductor layer and the second semiconductor layer.

Accordingly, the present invention creates a textured surface structure of plural protrusions on the epitaxy structure layer by controlling the energy intensity of the excimer laser not larger than 1000 mJ/cm$^2$ to allow non-uniform decomposition (GaN→Ga+½ N$_2$) to be executed in the epitaxy structure layer. In detail, the present invention found that the non-uniform decomposition would be executed in the epitaxy structure layer due to the difference in dislocation densities when the epitaxy structure layer is irradiated with multiple pulses of excimer laser having a suitable energy density. A larger amount of GaO$_x$ from the reaction between Ga generated from the decomposition of GaN and oxygen in air would be formed at locations with lower defect density and can shelter the GaN epitaxy with low defect density underneath from laser irradiation, whereas less GaO$_x$ is generated at locations with higher defect density, therewith the liquid Ga residuals tending to spread outwards with a burst of nitrogen. Accordingly, the locations with higher defect density are etched more vigorously compared to those with lower defect density, and thus plateaus or mesas are formed. Through such possible mechanism, the present invention can create a textured surface with plural dome-shaped first protrusions (analogues to semi-spherical protrusions).

According to the roughening method of the present invention, a step (B1) may be further included after the step (B): cleaning the roughened surface to remove depositions generated during the excimer laser irradiation. Herein, the method for cleaning the roughened surface is not particularly limited, and may be any suitable method which can be used to remove depositions generated during the excimer laser irradiation and causes no damages on the resultant textured surface structure created by excimer laser etching. For example, an acid agent may be used to clean the roughened surface.

In addition, the present invention further provides an epitaxy structure layer having a roughened surface with a plurality of dome-shaped first protrusions. Also, the present invention provides an epitaxy structure layer having a surface textured by excimer laser irradiation with an energy intensity of 1000 mJ/cm$^2$ or less. Herein, the epitaxy structure layer preferably is a GaN-based epitaxy structure layer, and may include a first semiconductor layer, an active layer and a second semiconductor layer, therewith the active layer being located between the first semiconductor layer and the second semiconductor layer.

According to the roughening method of the present invention, a step (C) may be further included after the step (B), preferably after the step (B1): performing a wet etching process on the roughened surface. Accordingly, the present invention further creates plural approximate hexagonal cone-shaped second protrusions on the dome-shaped first protrusions to obtain plural semi-spherical protrusions with hexagonal cones atop. In detail, a second roughening process may be further performed to texture the surfaces of the dome-shaped first protrusions and to create plural approximate hexagonal cone-shaped second protrusions on the dome-shaped first protrusions.

Moreover, the present invention further provides an epitaxy structure layer having a roughened surface with a plurality of dome-shaped first protrusions and a plurality of hexagonal cone-shaped second protrusions, therewith the hexagonal cone-shaped second protrusions being formed on the dome-shaped first protrusions. Also, the present invention provides an epitaxy structure layer having a surface textured by excimer laser irradiation with an energy intensity of 1000 mJ/cm$^2$ or less and then a wet etching process.

The above-mentioned novel roughening method can be applied in a process for fabricating a light-emitting diode (LED) to enhance the light extraction from the light emission surface, and also to bring the good ohmic characteristics which could be ascribed to the increase in the contact area and the significant enhancement of the carrier concentration near the surface, reduce the operation voltage and thus significantly improve the photoelectric properties of the LED.

Accordingly, the present invention further provides a method for manufacturing a light-emitting diode having a roughened surface, which includes: (A) providing an epitaxy component, including: a substrate; an epitaxy structure layer, disposed over the substrate and including a first semiconductor layer, an active layer and a second semiconductor layer, therewith the active layer being located between the first semiconductor layer and the second semiconductor layer, and the first semiconductor layer being located between the active layer and the substrate; and a first electrode, electrically communicating with the first semiconductor layer; (B) etching a surface of the second semiconductor layer with an excimer laser having an energy intensity of 1000 mJ/cm$^2$ or less to form a roughened surface; and (C) forming a second electrode layer over the second semiconductor layer.

According to the above-mentioned method for manufacturing an LED of the present invention, a step (B1) may be further included between the step (B) and the step (C): cleaning the roughened surface to remove depositions generated during the excimer laser irradiation. Herein, the method for cleaning the roughened surface is not particularly limited, and may be any suitable method that can be used to remove depositions (e.g. Ga, GaO$_x$) generated during the excimer laser irradiation and causes no damages on the resultant textured surface structure created by excimer laser etching. For example, an acid agent may be used to clean the roughened surface.

Accordingly, the present invention further provides an LED, which includes: a substrate; an epitaxy structure layer, disposed over the substrate 21' and including a first semiconductor layer, an active layer and a second semiconductor layer, therewith the active layer being located between the first semiconductor layer and the second semiconductor layer, the first semiconductor layer being located between the active layer and the substrate, and the second semiconductor layer having a roughened surface with a plurality of dome-shaped first protrusions; a first electrode layer, electrically communicating with the first semiconductor layer; and a second electrode layer, electrically communicating with the second semiconductor layer. Also, the present invention provides an LED, which includes: a substrate; an epitaxy structure layer, disposed over the substrate 21' and including a first semiconductor layer, an active layer and a second semiconductor layer, therewith the active layer being located between the first semiconductor layer and the second semiconductor layer, the first semiconductor layer being located between the active layer and the substrate, and the second semiconductor layer having a surface textured by excimer laser irradiation with an energy intensity of 1000 mJ/cm$^2$ or less; a first electrode layer, electrically communicating with the first semiconductor layer; and a second electrode layer, electrically communicating with the second semiconductor layer.

According to the above-mentioned method for manufacturing an LED of the present invention, a step (B2) may be further included between the step (B) and the step (C), preferably between the step (B1) and the step (C): performing a wet etching process on the roughened surface.

Accordingly, the present invention further provides an LED, which includes: a substrate; an epitaxy structure layer, disposed over the substrate 21' and including a first semiconductor layer, an active layer and a second semiconductor layer, therewith the active layer being located between the first semiconductor layer and the second semiconductor layer, the first semiconductor layer being located between the active layer and the substrate, and the second semiconductor layer having a roughened surface with a plurality of dome-shaped first protrusions and a plurality of hexagonal cone-shaped second protrusions formed on the dome-shaped first protrusions; a first electrode layer, electrically communicating with the first semiconductor layer; and a second electrode layer, electrically communicating with the second semiconductor layer. Also, the present invention provides an LED, which includes: a substrate; an epitaxy structure layer, disposed over the substrate 21' and including a first semiconductor layer, an active layer and a second semiconductor layer, therewith the active layer being located between the first semiconductor layer and the second semiconductor layer, the first semiconductor layer being located between the active layer and the substrate, and the second semiconductor layer having a surface textured by excimer laser irradiation with an energy intensity of 1000 mJ/cm$^2$ or less and then a wet etching process; a first electrode layer, electrically communicating with the first semiconductor layer; and a second electrode layer, electrically communicating with the second semiconductor layer.

In the present invention, the substrate preferably is a substitutive substrate to replace the growth substrate with poor heat dissipation (such as a sapphire substrate) and thus to enhance the heat dissipation of an LED. Accordingly, the epitaxy component may be prepared by the following step: (a1) providing an epitaxy wafer, which includes: a growth substrate; and an epitaxy structure layer, disposed over the growth substrate and including a first semiconductor layer, an active layer and a second semiconductor layer, therewith the active layer being located between the first semiconductor layer and the second semiconductor layer, and the second semiconductor layer being located between the active layer and the growth substrate; (a2) forming a first electrode layer over the first semiconductor layer; (a3) forming a substitutive substrate over the first electrode layer; and (a4) removing the growth substrate. Herein, the substitutive substrate can be formed by any conventional electroplating process or wafer bonding process, and preferably is a metal substrate (such as a nickel substrate) or a semiconductor substrate. In addition, the growth substrate can be removed by any conventional suitable method. Preferably, the growth substrate is removed by a laser-lift-off process. Accordingly, the present invention may use an identical equipment to perform the laser-lift-off process and the subsequent laser roughening process without an additional equipment to thereby reduce the equipment cost.

In the present invention, the energy intensity of the excimer laser preferably ranges from about 300 mJ/cm$^2$ to 900 mJ/cm$^2$, more preferably from about 750 mJ/cm$^2$ to 800 mJ/cm$^2$. Herein, the plural dome-shaped first protrusions can be created with multiple-pulse laser irradiation at an energy density of at least about 300 mJ/cm$^2$, and the pulses of laser can be reduced by increasing the laser energy intensity. In addition, in the case of the laser energy being larger than 850 mJ/cm$^2$, more protrusions may be further ablated and disappear with the increase of the laser energy density, and even all protrusions would disappear while the energy is higher than 1000 mJ/cm$^2$. Thereby, the laser energy density preferably ranges from 300 mJ/cm$^2$ to 900 mJ/cm$^2$, more preferably from about 750 mJ/cm$^2$ to 800 mJ/cm$^2$. Meanwhile, the diameter and height of the first protrusions may depend on the number of the laser pulses. Accordingly, a user can modify the diameter and height of the first protrusions by adjusting the number of the laser pulses. Herein, the excimer laser irradiation preferably is performed with about 30-50 pulses.

In the present invention, the excimer laser is not particularly limited. Examples of the excimer laser include, but are not limited to, KrF excimer laser, KrCl excimer laser, ArF excimer laser, XeCl excimer laser, or XeF excimer laser.

In the present invention, the etching agent used in the wet etching process is not particularly limited in kind and concentration, and may be any conventional suitable etching agent. For example, the etching agent may be an alkaline etching agent (e.g. KOH solution) with a concentration of about 0.01-10 M. Note that, the dome-shaped first protrusions may be smoothened in the case of increasing the time of the wet etching process, and consequently the surface is textured with only hexagonal cone-shaped second protrusions and no dome-shaped first protrusions. Accordingly, those skilled in the art can modify the time of the wet etching process based on the conditions with respect to the etching process and the etching agent. For example, the wet etching process may be performed for about 30-600 seconds.

In the present invention, the growth substrate is not particularly limited, and may be any conventional growth substrate suitable for the growth of epitaxial structure. Examples of the growth substrate include, but are not limited to, an insulating substrate (e.g. Al$_2$O$_3$ substrate), an absorbing substrate (e.g. GaAs substrate). Besides, a buffer layer may be further formed over the growth substrate to ensure the good quality of the epitaxy structure layer. Herein, the buffer layer is not particularly limited, and may be any buffer layer that is helpful to the growth of the epitaxy structure layer with good quality.

In the present invention, the epitaxy structure layer may be formed by any suitable epitaxy process, such as metal-organic chemical vapor deposition (MOCVD), liquid phase epitaxy (LPE), molecular beam epitaxy (MBE).

In the present invention, the first electrode layer preferably is located between the substrate and the first semiconductor layer, and its forming method is not particularly limited. For example, the first electrode layer may be formed by a deposition process, e.g. electroless plating, electroplating, electron beam deposition, sputtering, and thermal evaporation, but not limited thereto. In addition, the first electrode layer may be in a single-layered or multilayered structure, and may include, for example, an ohmic reflective layer and an adhesive layer, therewith the ohmic reflective layer being located between the adhesive layer and the first semiconductor layer. Herein, the ohmic reflective layer is not particularly limited in its material, and may be in a single-layered or multilayered structure. Preferably, the ohmic reflective layer is made of a reflective material capable of forming an ohmic contact with the first semiconductor layer. For example, in one aspect of the present invention, a Ni layer, an Ag layer and a Ni layer are formed in sequence on the first semiconductor layer as an ohmic reflective layer. Moreover, the adhesive layer is not particularly limited in its material, and may be in a single-layered or multilayered structure. For example, in one aspect of the present invention, a Cr layer, a Ti layer and an Au layer are formed in sequence on the ohmic reflective layer as an adhesive layer.

In the present invention, the second electrode layer preferably is located on the roughened surface of the second semiconductor layer, and its forming method is not particularly limited. For example, the second electrode layer may be formed by a deposition process, such as electroless plating, electroplating, electron beam deposition, sputtering, and thermal evaporation, but not limited thereto. In addition, the second electrode layer may be in a single-layered or multilayered structure. For example, in one aspect of the present invention, a Ti layer, an Al layer, a Ti layer and an Au layer are formed in sequence on the second semiconductor layer as a second electrode layer.

In the present invention, the electrical property of the first semiconductor layer is different from that of the second semiconductor layer. For example, the first semiconductor layer is an N-type semiconductor layer (e.g. n-GaN layer), while the second semiconductor layer is a P-type semiconductor layer (e.g. p-GaN layer); and the first semiconductor layer is a P-type semiconductor layer (e.g. p-GaN layer), while the second semiconductor layer is an N-type semiconductor layer (e.g. n-GaN layer).

As above mentioned, the novel excimer laser roughening method according to the present invention has advantages of simpler process, less time consumption and low manufacturing cost compared to the conventional roughening methods, e.g. producing photonic crystal by e-beam writer, creating a textured structure of hexagonal cones by photo-assisted cryogenic etching, and the photolithography technology. Meanwhile, in comparison with the conventional art where u-GaN is first removed by ICP and then a wet etching process is performed, the time for the first roughening process of the present invention is almost the same as that for removing u-GaN by ICP in the conventional art, and the second roughening process of the present invention also requires time equal to the wet etching time performed after ICP in the conventional art. That is, the two-step roughening process according to the present invention can be accomplished within the same period required by the conventional art and creates the most desirable textured surface structure of semi-spherical protrusions with hexagonal cones atop. Thereby, the LED manufactured by the present invention can present improved light extraction efficiency and reduced operation voltage.

DETAILED DESCRIPTION OF THE PREFERRED EMBODIMENT

Hereafter, examples will be provided to illustrate the embodiments of the present invention. Other advantages and effects of the invention will become more apparent from the disclosure of the present invention. It should be noted that these accompanying figures are simplified. The quantity, shape and size of components shown in the figures may be modified according to practically conditions, and the arrangement of components may be more complex. Other various aspects also may be practiced or applied in the invention, and various modifications and variations can be made without departing from the spirit of the invention based on various concepts and applications.

Example 1

FIGS. 2A to 2E show a process for manufacturing a light-emitting diode according to one preferred example of the present invention.

Figure 2A:
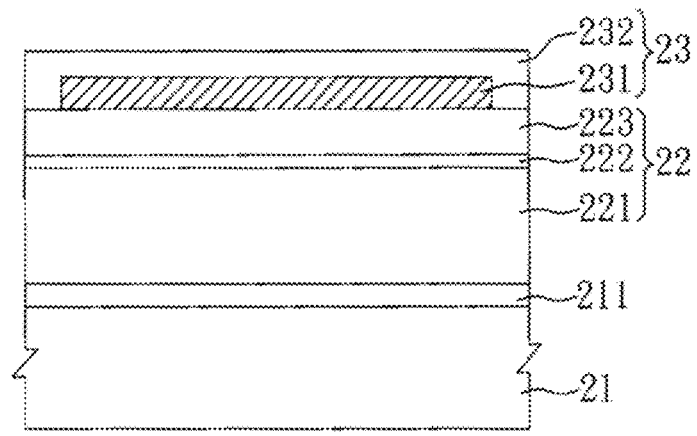
FIGS. 2A to 2E show a process for manufacturing an LED according to one preferred example of the present invention.

As shown in FIG. 2A, an epitaxy wafer having an epitaxy structure layer 22 formed over a growth substrate 21 is first cleaned by a RCA cleaning process, and then a first electrode layer 23 is formed on the epitaxy structure layer 22. In the epitaxy wafer taken by the present example, the growth substrate 21 is a sapphire substrate, and a buffer layer 211 is further formed on the growth substrate 21 to ensure the good quality of the epitaxy structure layer 22. Herein, an AN layer and an undoped GaN (u-GaN) layer are formed on the growth substrate 21 as the buffer layer 211. Additionally, a second semiconductor layer 221, an active layer 222 and a first semiconductor layer 223 are deposited on the buffer layer 211 by metal-organic chemical vapor deposition (MOCVD) to form the epitaxy structure layer 22. In the present example, the second semiconductor layer 221 is an n-GaN layer, while a p-AlGaN layer and a p-GaN layer are formed on the active layer 222 in sequence as the first semiconductor layer 223. Moreover, in the present example, an ohmic reflective layer 231 and an adhesive layer 232 are formed on the first semiconductor layer 223 of the epitaxy structure layer 22 as the first electrode layer 23. Herein, the ohmic reflective layer 231 is formed by depositing a Ni (about 1 nm)-Ag (about 200 nm)-Ni (about 100 nm) system on the first semiconductor layer 223 through an E-beam evaporator and performing an annealing process in $N_2$ ambient at about 500° C. for 10 minutes to form an ohmic contact with the first semiconductor layer 223 and to increase the light reflectivity to the light emission surface. Subsequently, a Cr (about 100 nm)-Ti (about 100 nm)-Au (about 100 nm) system is deposited on the ohmic reflective layer 231 to form the adhesive layer 232 through an E-beam evaporator.

Figure 2B:
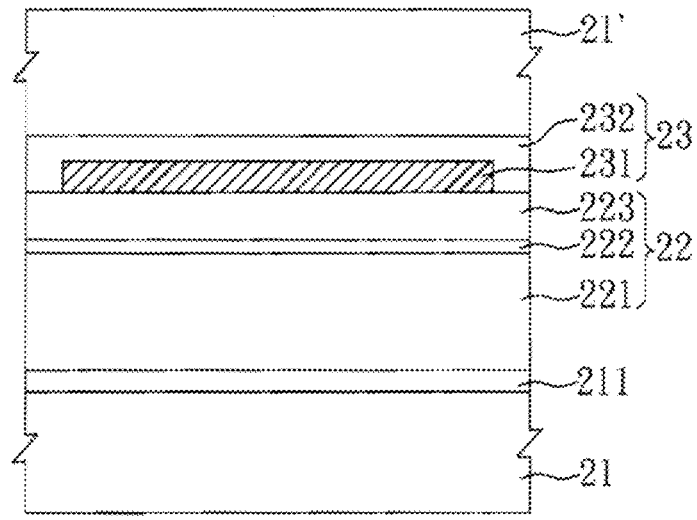

Next, as shown in FIG. 2B, another substrate 21' is formed on the first electrode layer 23 to replace the growth substrate 21. In detail, the substrate 21' is formed by an electroplating process under a constant current (0.6 A) for about 120 minutes. Herein, the substrate 21' according to the present example is a Ni layer of about 80 μm in thickness.

Figure 2C:
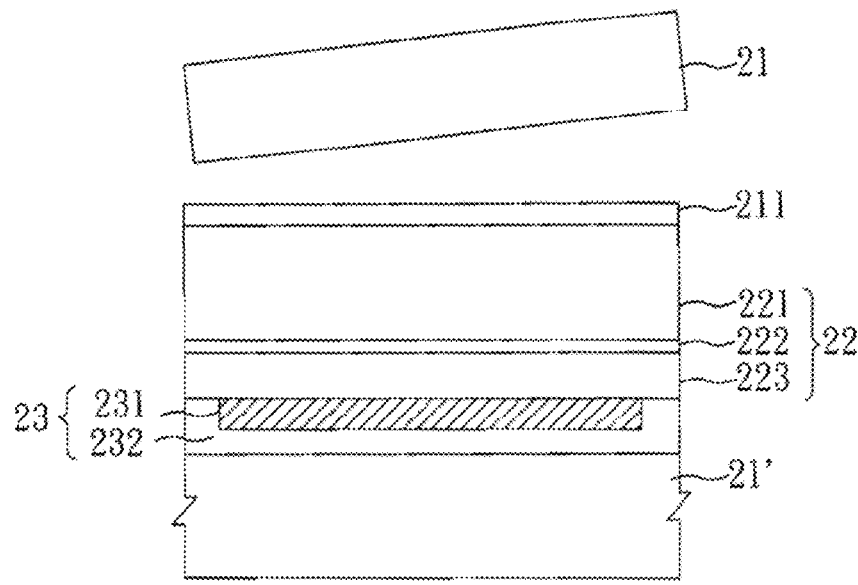

As shown in FIG. 2C, the growth substrate 21 is then removed. In the present example, a laser-lift-off (LLO) process is performed with a mask and single-pulse irradiation of a KrF excimer laser at a reactive energy density of about 800 $mJ/cm^2$ to accomplish the replacement of the growth substrate with the new substrate 21'. Accordingly, an epitaxy component as shown in FIG. 2C is obtained, which includes: a substrate 21'; an epitaxy structure layer 22, which is disposed over the substrate 21' and includes a first semiconductor layer 223, an active layer 222 and a second semiconductor layer 221, therewith the active layer 222 being located between the first semiconductor layer 223 and the second semiconductor layer 221, and the first semiconductor layer 223 being located between the active layer 222 and the substrate 21'; and a first electrode layer 23, disposed between the substrate 21' and the first semiconductor layer 223 to electrically communicate with the first semiconductor layer 223.

Figure 2D:
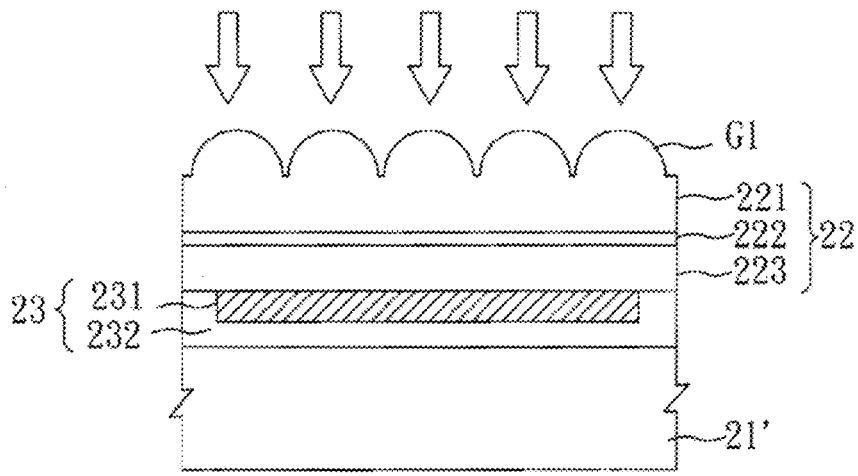
Figure 3A:
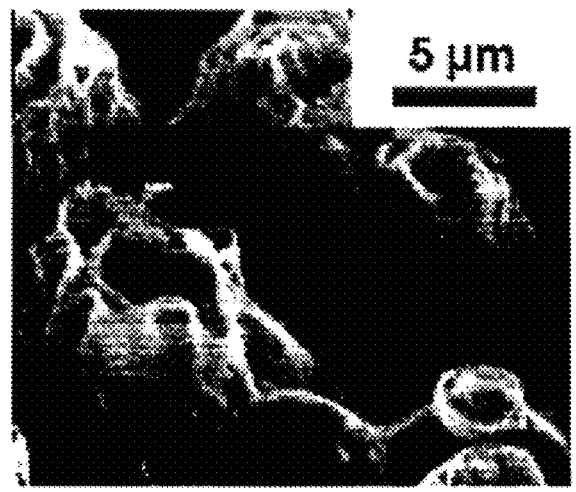
FIG. 3A shows a SEM image of the surface morphology of the component treated with laser etching.
Figure 3B:
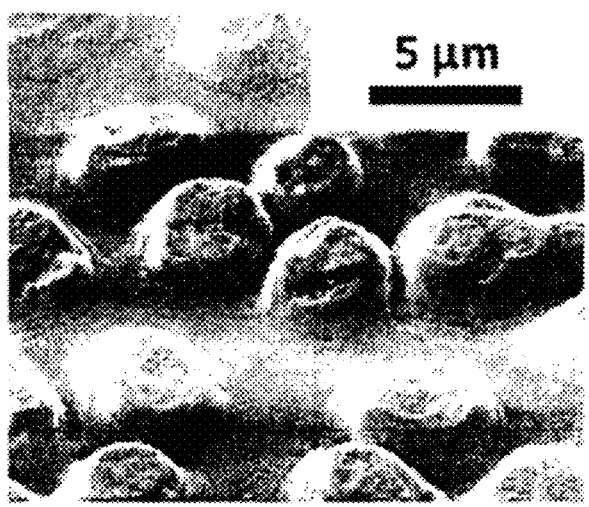
FIG. 3B shows a SEM image of the surface morphology of the component cleaned with an acid agent.

Subsequently, as shown in FIG. 2D, the same excimer laser is employed to etch the u-GaN left after the LLO process and to then rough the exposed surface of the second semiconductor layer 221. Then, the resultant roughed surface is cleaned by an acid agent (i.e. a diluted liquid of HCl and HF) to remove Ga and $GaO_x$ residues generated during the process for etching the surface of the second semiconductor layer 221. In detail, the present example utilizes the KrF excimer laser with 120 pulses at 750 $mJ/cm^2$ to perform the first surface roughening process and thus to form a plurality of dome-shaped first protrusions G1 (analogous to semi-spherical protrusions). Herein, the surface morphology of the component treated with the first surface roughening process is observed under a scanning electron microscope (SEM), as shown in FIGS. 3A and 3B. FIG. 3A shows the SEM image of the surface morphology of the component treated with the laser irradiation, in which the first protrusions are covered with Ga and GaO, residues generated during the laser etching process and thus crater-like protrusions are observed. In addition, FIG. 3B shows the SEM image of the surface morphology of the component cleaned with an acid agent, in which Ga and $GaO_x$ residues generated during the laser etching process are removed and thus the dome-shaped first protrusions are observed. Accordingly, in the present example, the first protrusions of about 1.5-2 μm in height and about 3-4 μm in diameter at bottom are created in a density of about $10^6$ cm$^{-2}$.

Figure 2E:
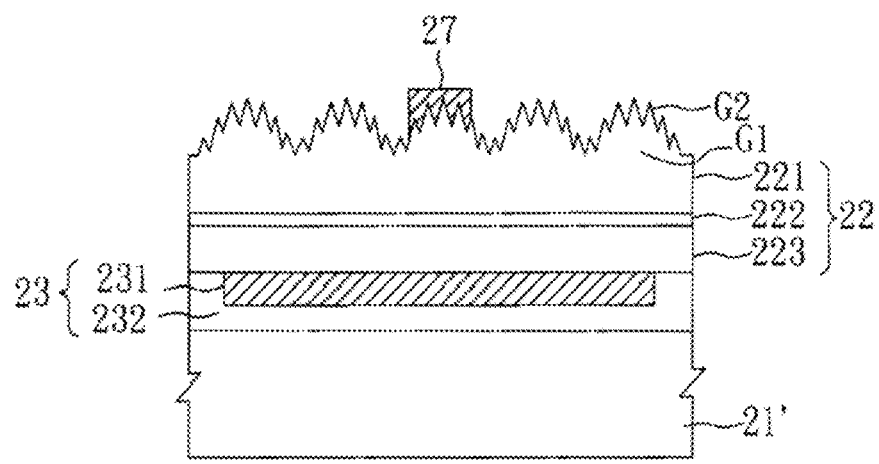
Figure 3C:
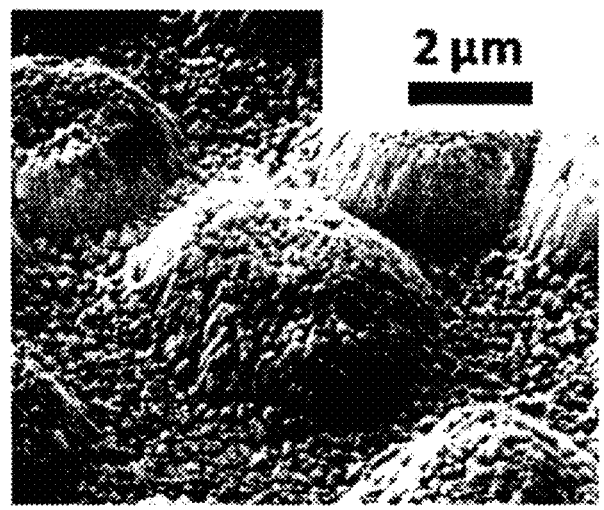
FIG. 3C shows a SEM image of the surface morphology of the component treated with wet etching.

Finally, as shown in FIG. 2E, a second roughening process is performed on the roughened surface of the second semiconductor layer 221 by wet etching, and then a second electrode layer 27 is formed on the semiconductor layer 221 of the epitaxy structure layer 22 to accomplish the structure as shown in FIG. 2E. In detail, the component is dipped into an etching agent to further create a plurality of hexagonal cone-shaped second protrusions G2 on the cambered surfaces of the first protrusions G1. Herein, the present example takes a 60° C. KOH solution of about 6M as the etching agent to perform the etching process for 120 seconds. In addition, the surface morphology of the component treated with the second surface roughening process is observed under a scanning electron microscope (SEM), as shown in FIG. 3C. Accordingly, the present example yields a plurality of semi-spherical protrusions with hexagonal cones atop through a two-step surface roughening scheme, therewith the second protrusions on the cambered surfaces of the dome-shaped first protrusions having a height of about 50-200 nm. Moreover, in the present example, a Ti/Al/Ti/Au metal system is deposited as the second electrode layer 27.

Accordingly, as shown in FIG. 2E, the present example provides a light-emitting diode, which includes: a substrate 21'; an epitaxy structure layer 22, disposed over the substrate 21' and including a first semiconductor layer 223, an active layer 222 and a second semiconductor layer 221, therewith the active layer 222 being located between the first semiconductor layer 223 and the second semiconductor layer 221, the first semiconductor layer 223 being located between the active layer 222 and the substrate 21', and the second semiconductor layer 221 having a roughened surface with a plurality of dome-shaped first protrusions G1 and a plurality of hexagonal cone-shaped second protrusions G2 formed on the surfaces of the dome-shaped first protrusions G1; a first electrode layer 23, disposed between the substrate 21' and the first semiconductor layer 223 to electrically communicate with the first semiconductor layer 223; and a second electrode layer 27, disposed on the roughened surface of the second semiconductor layer 221 to electrically communicate with the second semiconductor layer 221.

Example 2

The manufacturing method and structure of the light-emitting diode according to the present example are almost the same as those illustrated in Example 1, except that the first roughening process according to the present example is performed with 30 pulses laser irradiation.

Example 3

The manufacturing method and structure of the light-emitting diode according to the present example are almost the same as those illustrated in Example 1, except that the first roughening process according to the present example is performed with 210 pulses laser irradiation.

Example 4

The manufacturing method and structure of the light-emitting diode according to the present example are almost the same as those illustrated in Example 1, except that the first roughening process according to the present example is performed with 500 pulses laser irradiation at about 300 mJ/cm$^2$.

Example 5

The manufacturing method and structure of the light-emitting diode according to the present example are almost the same as those illustrated in Example 1, except that the first roughening process according to the present example is performed with 120 pulses laser irradiation at about 800 mJ/cm$^2$.

Example 6

The manufacturing method and structure of the light-emitting diode according to the present example are almost the same as those illustrated in Example 1, except that the first roughening process according to the present example is performed with 30 pulses laser irradiation at about 900 mJ/cm$^2$.

Comparative Example 1

Figure 1A:
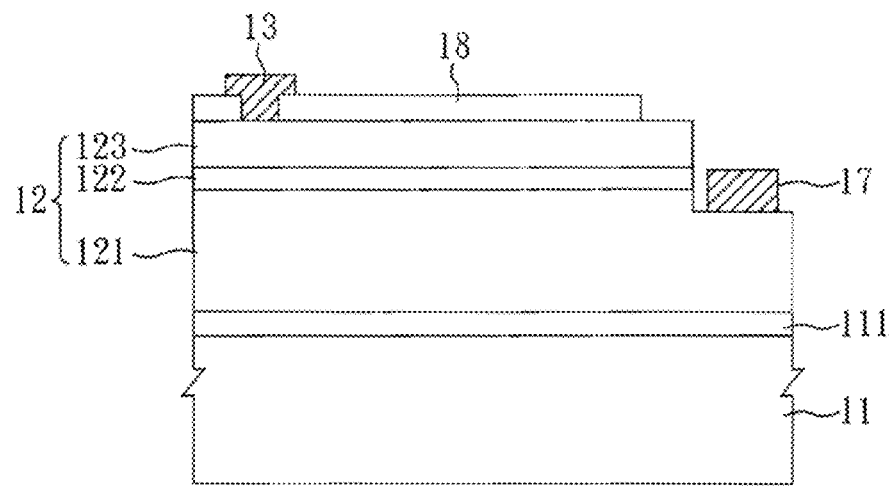
FIG. 1A shows a cross-sectional view of a conventional lateral GaN-based LED.

The light-emitting diode according to the present comparative example are illustrated in FIG. 1A, in which the epitaxy wafer taken by the present comparative example is the same as that used in Example 1, and the transparent conductive layer 18 is made of nickel gold oxide.

Comparative Example 2

Figure 1B:
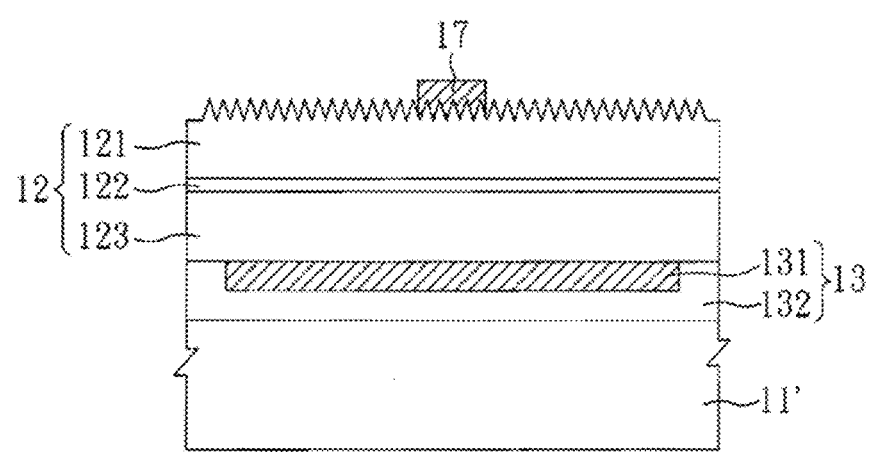
FIG. 1B shows a cross-sectional view of a conventional vertical-structured GaN-based LED.

The light-emitting diode according to the present comparative example are illustrated in FIG. 1B and its manufacturing method is almost the same as that disclosed in Example 1, except that merely one roughening process is performed in the present comparative example. In detail, after removing the growth substrate, the present comparative example utilizes inductively coupled plasma (ICP) to remove u-GaN left after the LLO process, and then uses a KOH solution of about 6M to perform a wet etching process for about 120 seconds, resulting in the formation of the hexagonal cone-textured surface, as shown in FIG. 1B.

Test Example 1

Figure 4:
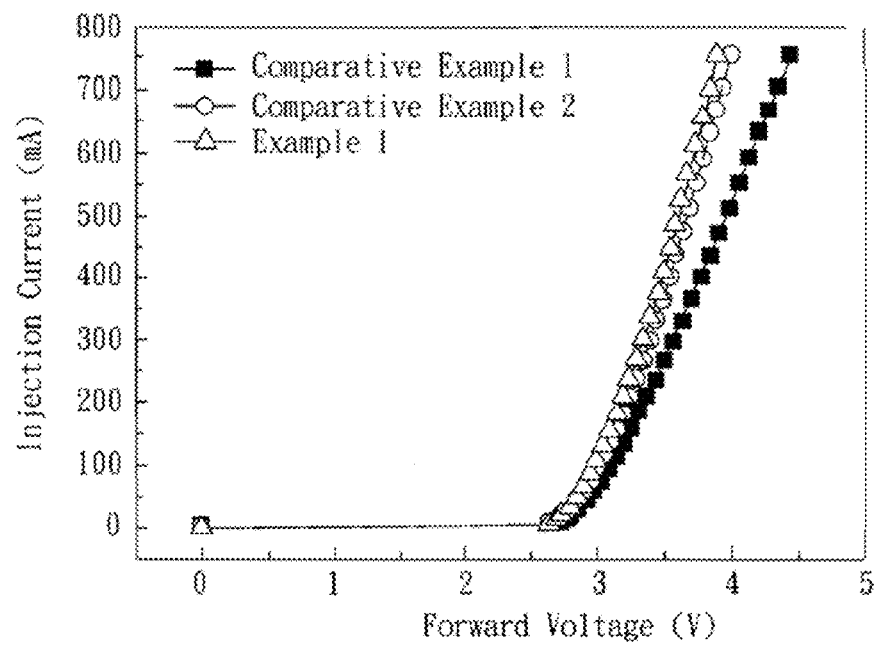
FIG. 4 shows the forward current-voltage (I-V) characteristics of Example 1 and Comparative Examples 1-2 according to the present invention.

Comparisons of the forward current-voltage (I-V) characteristics of Example 1 and Comparative Examples 1-2 are shown in FIG. 4. As shown in FIG. 4, the forward voltage of the device according to Example 1 decreases from 3.67 V to 3.41 V at 350 mA and from 4.45 V to 3.89 V at 750 mA compared to that according to Comparative Example 1. In addition, the device according to Example 1 also shows a decrease in the forward voltage drop of 0.12 V at 750 mA compared to that according to Comparative Example 2. Those results indicate that the light-emitting diode according to Example 1 of the present invention have enhanced carrier concentration, increased contact area between the electrode and the component surface, reduced series resistance and lowered power consumption.

Test Example 2

Figure 5:
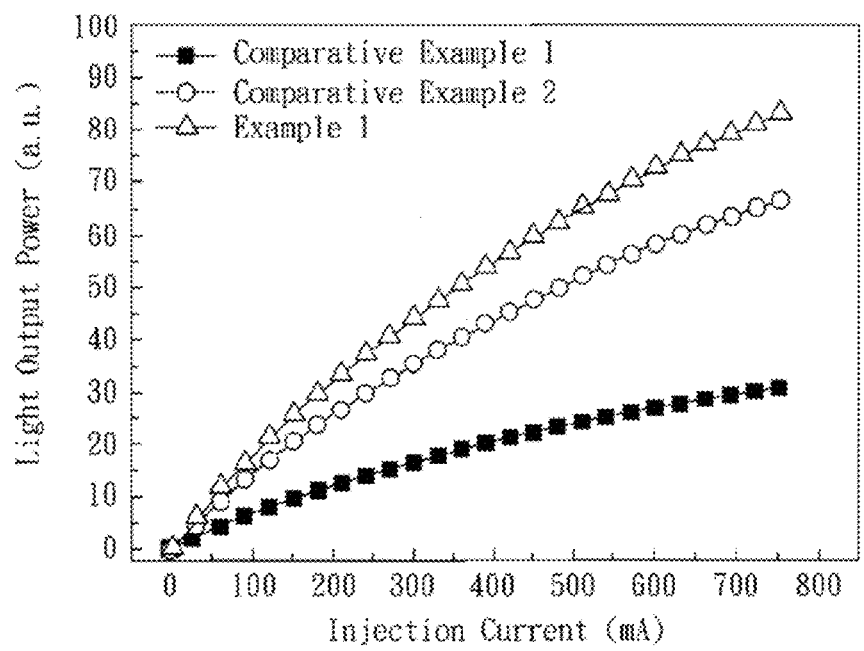
FIG. 5 shows the light output power-current (Lop-I) characteristics of Example 1 and Comparative Examples 1-2 according to the present invention.

Comparisons of the light output power-current (Lop-I) characteristics of Example 1 and Comparative Examples 1-2 are shown in FIG. 5. As shown in FIG. 5, the light output power (Lop) of the device according to Example 1 is enhanced by 125% at 350 mA and 106.6% at 750 mA as compared to that according to Comparative Example 1, or 25% at 350 mA as compared to that according to Comparative Example 2. The results indicate that the device according to Example 1 of the present invention also shows improved light output power in addition to increased contact area.

The above examples are intended for illustrating the embodiments of the subject invention and the technical features thereof, but not for restricting the scope of protection of the subject invention. The scope of the subject invention is based on the claims as appended.

What is claimed is:

1. A method for manufacturing a light-emitting diode having a roughened surface, including:
   (A) providing an epitaxy component, comprising: a substrate; an epitaxy structure layer, disposed over the substrate and comprising a first semiconductor layer, an active layer and a second semiconductor layer, therewith the active layer being located between the first semiconductor layer and the second semiconductor layer, and the first semiconductor layer being located between the active layer and the substrate; and a first electrode, electrically communicating with the first semiconductor layer;
   (B) etching a surface of the second semiconductor layer with an excimer laser having an energy intensity of 1000 mJ/cm$^2$ or less to form a first roughened surface comprising a plurality of first protrusions;
   (B2) perfoming a wet etching process on the first roughened surface to form a plurality of second protrusions; and
   (C) forming a second electrode layer over the second semiconductor layer.

2. The method as claimed in claim 1, wherein the energy intensity of the excimer laser ranges from 300 mJ/cm$^2$ to 900 mJ/cm$^2$.

3. The method as claimed in claim 2, wherein the step (B) is performed with 30 to 500 pulses of the excimer laser.

4. The method as claimed in claim 1, wherein the excimer laser is KrF excimer laser, KrC1 excimer laser, ArF excimer laser, XeCl excimer laser, or XeF excimer laser.

5. The method as claimed in claim 1, wherein the wet etchin process is performed with an etching agent of 0.01 M to 10M for 30 seconds to 600 seconds.

6. A method for roughening an epitaxy structure layer, comprising:
   (A) providing an epitaxy structure layer;
   (B) etching a surface of the epitaxy structure layer with an excimer laser having an energy density of 1000 mJ/cm$^2$ or less to form a first roughened surface comprising a plurality of first protrusions; and
   (C) performing a wet etching process on the first roughened surface to form a plurality of second protrusions.

7. The method as claimed in claim 6, wherein the energy intensity of the excimer laser ranges from 300 mJ/cm$^2$ to 900 mJ/cm$^2$.

8. The method as claimed in claim 7, wherein the step (B) is performed with 30 to 500 pulses of the excimer laser.

9. The method as claimed in claim 6, wherein the excimer laser is KrF excimer laser, KrCl excimer laser, ArF excimer laser, XeCl excimer laser, or XeF excimer laser.

10. The method as claimed in claim 6, wherein the wet etching process is performed with an etching agent of 0.01 M to 10M for 30 seconds to 600 seconds.

* * * * *